(12) United States Patent
Bai et al.

(10) Patent No.: US 12,342,523 B2
(45) Date of Patent: Jun. 24, 2025

(54) METHOD FOR MANUFACTURING MEMORY AND MEMORY

(71) Applicant: CHANGXIN MEMORY TECHNOLOGIES, INC., Hefei (CN)

(72) Inventors: Weiping Bai, Hefei (CN); Li Zhu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 828 days.

(21) Appl. No.: 17/500,245

(22) Filed: Oct. 13, 2021

(65) Prior Publication Data

US 2022/0336462 A1 Oct. 20, 2022

Related U.S. Application Data

(63) Continuation of application No. PCT/CN2021/109361, filed on Jul. 29, 2021.

(30) Foreign Application Priority Data

Apr. 15, 2021 (CN) .......................... 202110406663.3

(51) Int. Cl.
H10B 12/00 (2023.01)
(52) U.S. Cl.
CPC ............. *H10B 12/03* (2023.02); *H10B 12/30* (2023.02)
(58) Field of Classification Search
CPC ...... H10B 12/03; H10B 12/30; H10B 12/033; H10B 12/31; H10B 12/0355;
(Continued)

(56) References Cited

U.S. PATENT DOCUMENTS 6,030,867 A 2/2000 Chien et al.
6,423,591 B2* 7/2002 Nakamura ........... H10B 12/033
438/254
(Continued)

FOREIGN PATENT DOCUMENTS

CN 102113115 A 6/2011
CN 107093604 A 8/2017
(Continued)

OTHER PUBLICATIONS

International Search Report cited in PCT/CN2021/109361, mailed Jan. 20, 2022, 10 pages.

*Primary Examiner* — Yara B Green
*Assistant Examiner* — Erika H Son
(74) *Attorney, Agent, or Firm* — Kilpatrick Townsend & Stockton LLP

(57) ABSTRACT

The present application provides a method for manufacturing a memory and a memory, which relate to the technical field of memory devices and are used to solve the technical problems of relatively low storage speed and storage efficiency. The manufacturing method includes: providing a substrate, a plurality of capacitor contact pads being disposed at intervals in the substrate; forming a first recess on a first surface of each of the capacitor contact pads; forming conductive pillars in the first recesses, upper end surfaces of the conductive pillars being flush with the first surfaces of the capacitor contact pads; and forming a plurality of capacitors on the substrate, the plurality of the capacitors and the plurality of the capacitor contact pads corresponding one to one and being electrically connected; wherein a first plate of each of the capacitors covers the corresponding conductive pillar.

10 Claims, 15 Drawing Sheets

(58) Field of Classification Search
CPC ............ H10B 12/315; H01L 21/76865; H01L 21/76877; H01L 21/76879; H01L 21/7688; H01L 21/76883
See application file for complete search history.

(56) References Cited

U.S. PATENT DOCUMENTS

| | | | | |
|---|---|---|---|---|
| 6,586,794 | B2* | 7/2003 | Nakamura | H01L 28/91 |
| | | | | 257/241 |
| 6,867,096 | B2* | 3/2005 | Cho | H01L 28/91 |
| | | | | 438/399 |
| 7,951,682 | B2* | 5/2011 | Ku | H01L 28/90 |
| | | | | 438/758 |
| 8,035,198 | B2 | 10/2011 | Ding et al. | |
| 10,591,790 | B2 | 3/2020 | Long et al. | |
| 2004/0266100 | A1 | 12/2004 | Cho et al. | |
| 2005/0218408 | A1 | 10/2005 | Yun et al. | |
| 2021/0272961 | A1 | 9/2021 | Tung et al. | |

FOREIGN PATENT DOCUMENTS

| | | |
|---|---|---|
| CN | 206628470 U | 11/2017 |
| CN | 108010913 A | 5/2018 |
| CN | 110504283 A | 11/2019 |
| CN | 111640747 A | 9/2020 |
| CN | 112951770 A | 6/2021 |

\* cited by examiner

METHOD FOR MANUFACTURING MEMORY AND MEMORY

CROSS-REFERENCE TO RELATED APPLICATIONS

This is a continuation of International Application No. PCT/CN2021/109361, filed on Jul. 29, 2021, which claims the priority to Chinese Patent Application 202110406663.3, titled "METHOD FOR MANUFACTURING MEMORY AND MEMORY", filed on Apr. 15, 2021. The entire contents of International Application No. PCT/CN2021/109361 and Chinese Patent Application 202110406663.3 are incorporated herein by reference.

TECHNICAL FIELD

The present application relates to the technical field of memory devices, and in particular, to a method for manufacturing a memory and a memory.

BACKGROUND

With the continuous development of semiconductor technology and memory technology, electronic equipment continues to develop toward miniaturization and integration. Dynamic Random Access Memory (DRAM) is widely used in electronic equipment due to its relatively high storage density and relatively fast read and write speed. The DRAM is generally composed of a plurality of memory cells, and each memory cell usually includes a transistor structure and a capacitor. The capacitor stores data information, and the transistor structure controls the read and write of data information in the capacitor.

In the DRAM, the capacitor is usually disposed on a substrate and electrically connected to a capacitor contact pad in the substrate. However, as the size decreases, the contact area between the capacitor and the capacitor contact pad is increasingly small, and the contact resistance increases, which affects the storage speed and storage efficiency of the memory.

SUMMARY

In the first aspect, an embodiment of the present application provides a method for manufacturing a memory, including: providing a substrate, a plurality of capacitor contact pads being disposed at intervals in the substrate; forming a first recess on a first surface of each of the capacitor contact pads; forming conductive pillars in the first recesses, upper end surfaces of the conductive pillars being flush with the first surfaces of the capacitor contact pads; and forming a plurality of capacitors on the substrate, the plurality of the capacitors and the plurality of the capacitor contact pads corresponding one to one and being electrically connected; wherein a first plate of each of the capacitors covers the conductive pillar in the corresponding capacitor contact pad, and a material of the first plates is the same as a material of the conductive pillars.

In the second aspect, an embodiment of the present application further provides a memory, including: a substrate and capacitors disposed on the substrate, a plurality of capacitor contact pads being disposed at intervals in the substrate, a conductive pillar being disposed in each of the capacitor contact pads; and the capacitors include: a second plate, the second plate being formed with a plurality of first hole structures, the plurality of the first hole structures being in one-to-one correspondence with the plurality of the capacitor contact pads; a dielectric layer, the dielectric layer being disposed on walls of the first hole structures, part of the dielectric layer in the first hole structures enclosing second hole structures; and first plates, the first plates being disposed in the second hole structures, the first plates being electrically connected to the capacitor contact pads and covering the corresponding conductive pillars, a material of the conductive pillars being the same as a material of the first plates.

DETAILED DESCRIPTION

In the related technology, a first plate of a capacitor is electrically connected to a capacitor contact pad. Usually, the first plate is disposed above the capacitor contact pad, and a lower end surface of the first plate is in contact with an upper end surface of the capacitor contact pad. However, as the size decreases, the contact area between the first plate and the capacitor contact pad decreases, and the contact resistance between the first plate and the capacitor contact pad increases, resulting in relatively low storage speed and storage efficiency of a memory.

In order to improve the storage speed and storage efficiency, an embodiment of the present application provides a method for manufacturing a memory. A conductive pillar is formed in a capacitor contact pad, an upper end surface of the conductive pillar is flush with an upper end surface of the capacitor contact pad, a capacitor is then formed, a first plate of the capacitor covers the corresponding conductive pillar, and the material of the first plate is the same as that of the conductive pillar, which increase the contact area of the conductive pillar and the first plate as a whole with the capacitor contact pad, and reduce the contact resistance between the capacitor and the capacitor contact pad, thereby improving the storage efficiency and storage speed.

To make the above objectives, features, and advantages of the embodiments of the present application more obvious and understandable, the following clearly and completely describes the technical solutions in the embodiments of the present application with reference to the accompanying drawings in the embodiments of the present application. Apparently, the described embodiments are some but not all of the embodiments of the present application. All other embodiments obtained by those of ordinary skill in the art without any creative efforts based on the embodiments of the present application shall fall within the protection scope of the present application.

Figure 1:
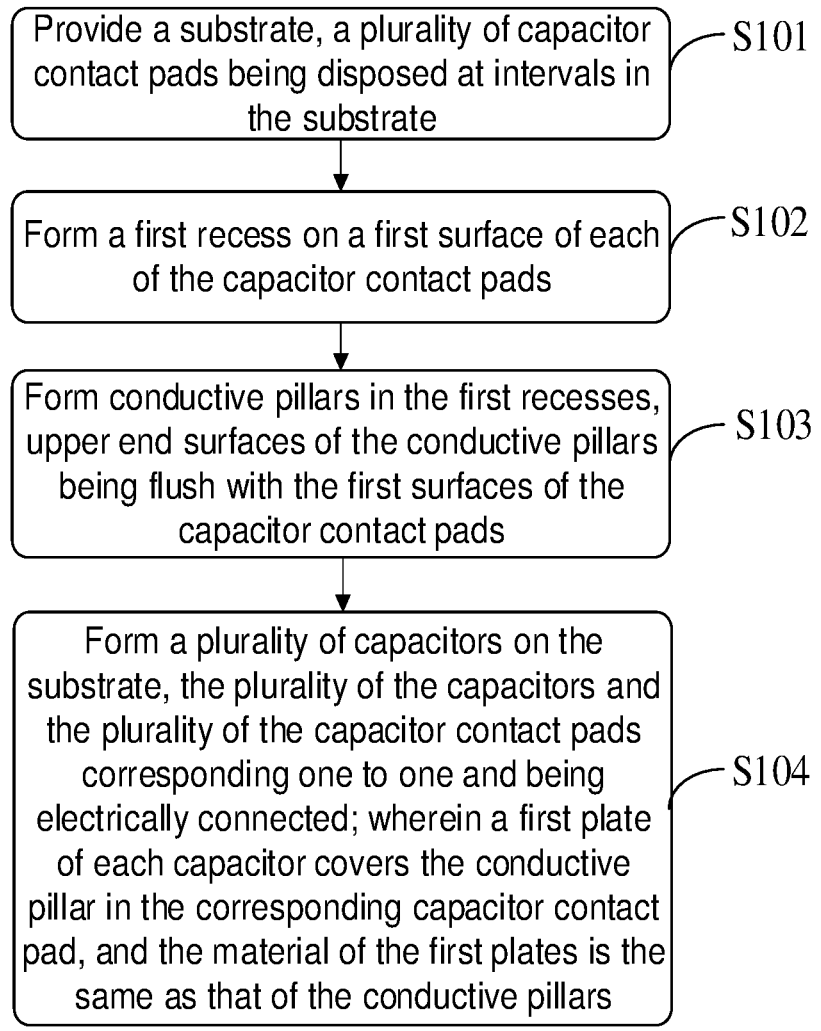
FIG. 1 is a flowchart of a method for manufacturing a memory in an embodiment of the present application.

Referring to FIG. 1, an embodiment of the present application provides a method for manufacturing a memory. The manufacturing method includes the following steps:

Step S101, a substrate is provided, a plurality of capacitor contact pads being disposed at intervals in the substrate.

Figure 2:
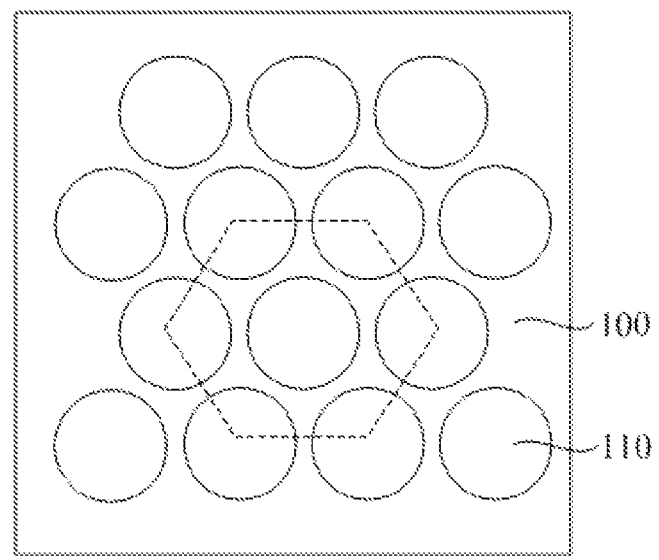
FIG. 2 is a top view of a substrate in an embodiment of the present application.
Figure 3:
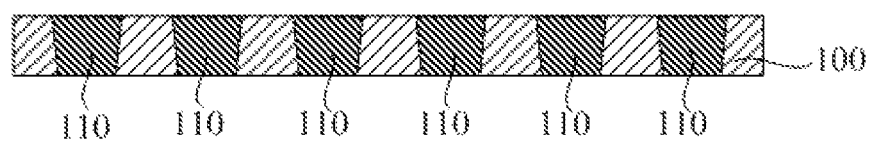
FIG. 3 is a schematic structure diagram of the substrate in an embodiment of the present application.

Referring to FIGS. 2 and 3, the substrate 100 serves as a support component of a memory for supporting other components disposed thereon. A plurality of capacitor contact pads 110 may be disposed in the substrate 100, and the capacitor contact pads 110 are arranged at intervals and in a honeycomb shape in the substrate 100. Exemplarily, as shown in FIG. 2, among the plurality of capacitor contact pads 110, one capacitor contact pad 110 is located in the center, six capacitor contact pads 110 are disposed around the capacitor contact pad 110, and the connecting lines of centers of the six capacitor contact pads 110 form a regular hexagon.

The material of the capacitor contact pads 110 includes tungsten (W), which facilitates subsequent electrical connection with capacitors. The material of the substrate 100 includes silicon oxide ($SiO_2$), which electrically isolates the capacitor contact pads 110 in the substrate 100 and prevents electrical connection between adjacent capacitor contact pads 110. Of course, the material of the capacitor contact pads 110 and the material of the substrate 100 are not limited. For example, the material of the capacitor contact pads 110 may also be one or more of titanium nitride, titanium tungsten, aluminum, or copper.

Step S102, a first recess is formed on a first surface of each capacitor contact pad.

Referring to FIGS. 4-11, the first surfaces of the capacitor contact pads 110 are the surfaces of the capacitor contact pads 110 exposed to the substrate 100, that is, the upper surfaces of the capacitor contact pads 110 as shown in FIGS. 4-11. A first recess 111 is formed on the upper surface of each capacitor contact pad 110. Exemplarily, the first recesses 111 may be formed by patterning, that is, a desired pattern is formed on the capacitor contact pads 110 by glue coating, exposure, development, etching, glue removal, etc.

Figure 4:
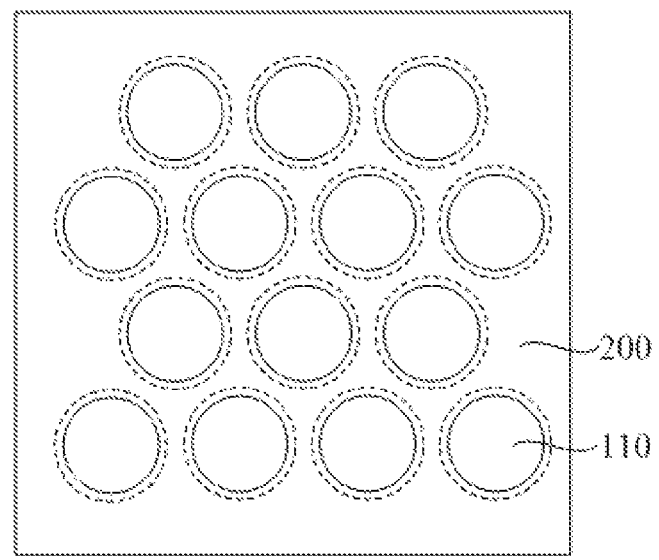
FIG. 4 is a top view after forming a photoresist layer in an embodiment of the present application.
Figure 5:
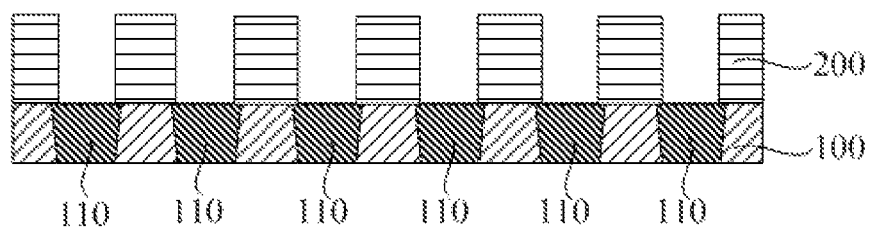
FIG. 5 is a schematic structure diagram after forming the photoresist layer in an embodiment of the present application.

In some possible examples, the forming a first recess on the first surface of each capacitor contact pad includes:

Referring to FIGS. 4 and 5, a photoresist layer 200 is formed on the substrate, the photoresist layer 200 having a first pattern. As shown in FIGS. 4 and 5, the photoresist layer 200 has a fourth hole structures penetrating this layer, and the fourth hole structures expose the capacitor contact pads 110.

As shown in the top view of FIG. 4, the circles shown by the dotted line represent the edges of the first surfaces of the capacitor contact pads 110, and the hole area of the fourth hole structures is smaller than the area of the first surfaces of the corresponding capacitor contact pads 110, so that the center regions of the capacitor contact pads 110 are exposed, and the edge regions of the capacitor contact pads 110 are not exposed. That is, the photoresist layer 200 covers the edge regions of the first surfaces of the capacitor contact pads 110 and the substrate 100, so as to form the first recesses 111 on the first surfaces of the capacitor contact pads 110.

Figure 6:
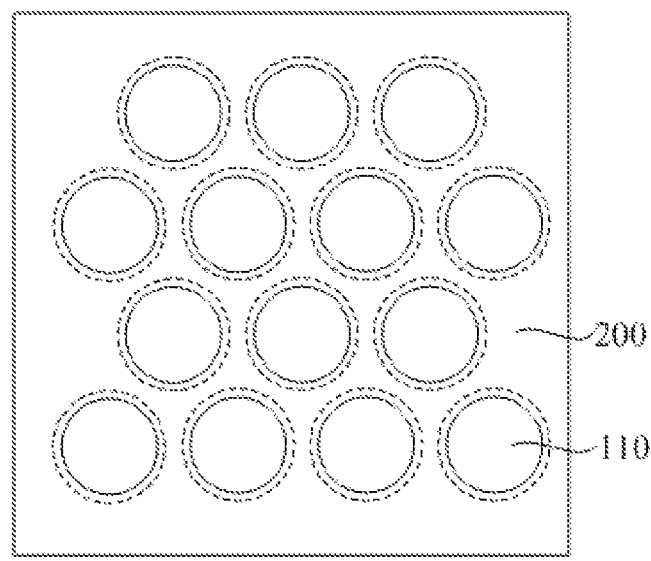
FIG. 6 is a top view after forming first recesses in an embodiment of the present application.
Figure 7:
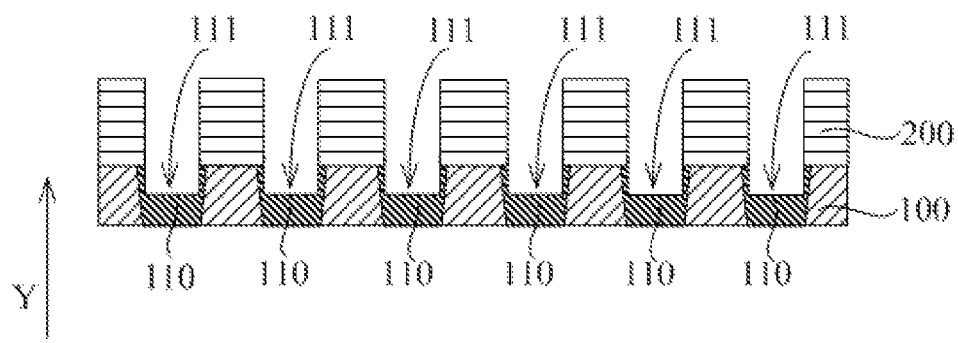
FIG. 7 is a schematic structure diagram after forming the first recesses in an embodiment of the present application.

Referring to FIGS. 6 and 7, after the photoresist layer 200 is formed, the capacitor contact pads 110 are etched along the first pattern, to form the first recesses 111 on the first surfaces of the capacitor contact pads 110. As shown in FIG. 6 and FIG. 7, parts of the capacitor contact pads 110 are etched and removed to form the first recesses 111. Exemplarily, the opening area of the first recesses 111 may be ⅓ to ½ of the area of the first surfaces of the capacitor contact pads 110. The opening area of the first recesses 111 refers to the area of the opening ends of the first recesses 111, that is, the area of the upper opening ends of the first recesses 111 shown in FIGS. 6 and 7.

The depth of the first recesses 111 may be ⅓ to ⅔ of the thickness of the capacitor contact pads 110. The depth of the first recesses 111 refers to the distance between the bottoms of the first recesses 111 and the opening ends of the first recesses 111, and the thickness of the capacitor contact pads 110 refers to the distance between the first surfaces of the capacitor contact pads 110 and the second surfaces opposite to the first surfaces. That is, the depth of the first recesses 111 and the thickness of the capacitor contact pads 110 both refer to the sizes in the vertical direction (Y direction) shown in FIG. 7.

After the first recesses 111 are formed on the first surfaces of the capacitor contact pads 110, the photoresist layer 200 is removed. Exemplarily, the photoresist layer 200 may be removed by ashing or the like. After the photoresist layer 200 is removed, the substrate 100 is exposed.

Step S103, conductive pillars are formed in the first recesses, upper end surfaces of the conductive pillars being flush with the first surfaces of the capacitor contact pads.

Figure 9:
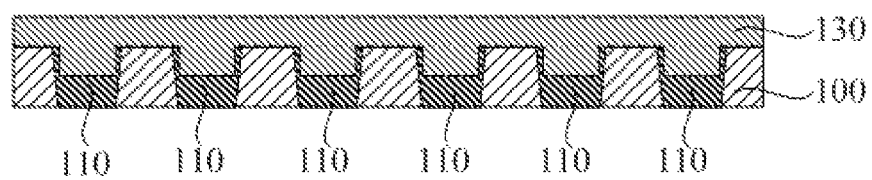
FIG. 9 is a schematic structure diagram after forming the first conductive layer in an embodiment of the present application.
Figure 10:
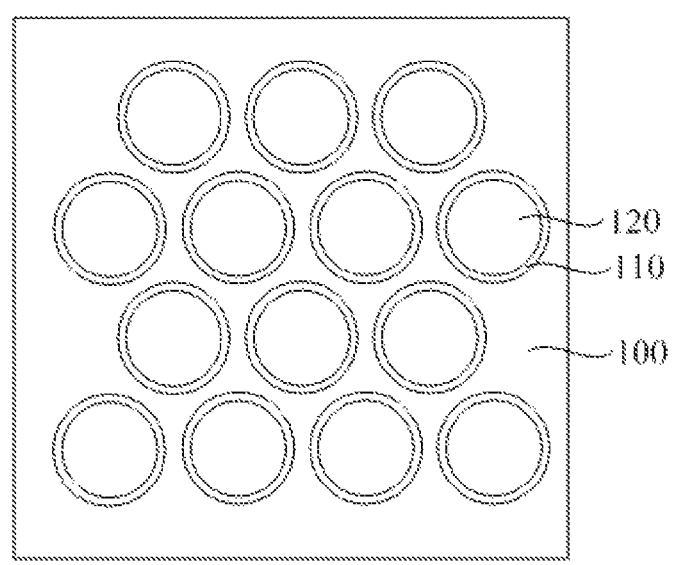
FIG. 10 is a top view after forming conductive pillars in an embodiment of the present application.
Figure 11:
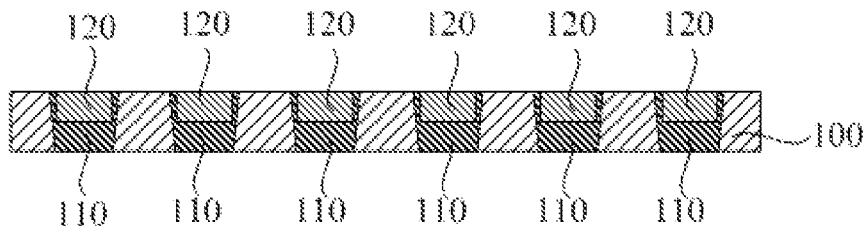
FIG. 11 is a schematic structure diagram after forming the conductive pillars in an embodiment of the present application.
Figure 12:
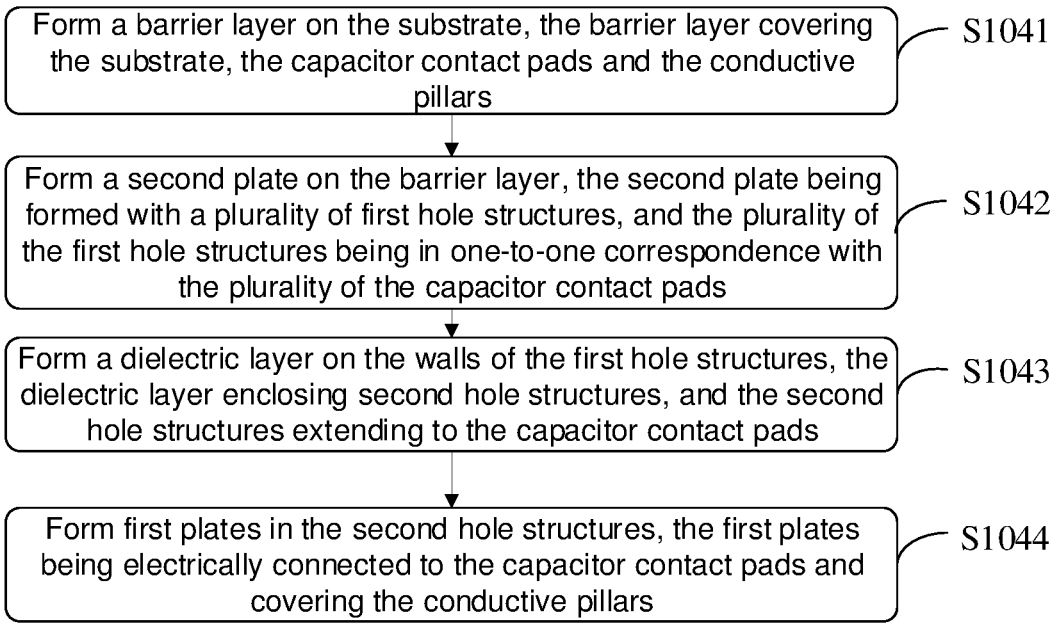
FIG. 12 is a flowchart of forming a plurality of capacitors in an embodiment of the present application.

Referring to FIGS. 8-11, conductive pillars 120 are formed in the first recesses 111 by deposition, the conductive pillars 120 fill the first recesses 111, and the upper end surfaces of the conductive pillars 120 are flush with the first surfaces of the capacitor contact pads 110, so that the upper surface of the structure shown in FIG. 11 is flat.

Figure 8:
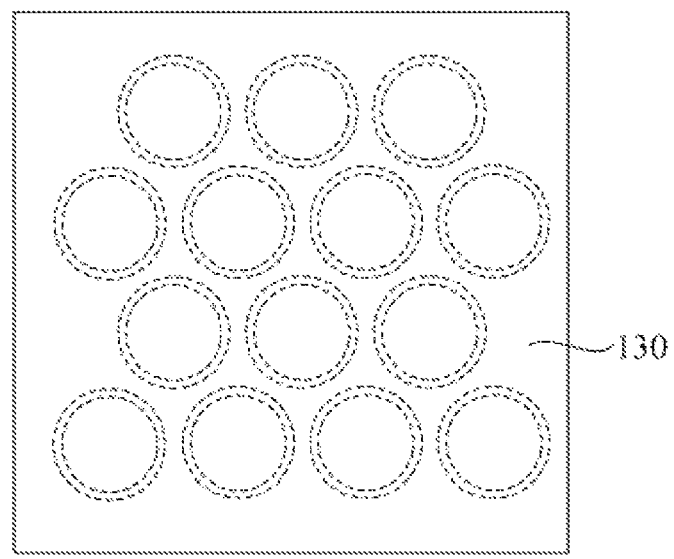
FIG. 8 is a top view after forming a first conductive layer in an embodiment of the present application.

In some possible examples, the forming conductive pillars in the first recesses, upper end surfaces of the conductive pillars being flush with the first surfaces of the capacitor contact pads includes:

A conductive material is deposited in the first recesses 111 and on the substrate 100 to form a first conductive layer 130. Referring to FIGS. 8 and 9, the first conductive layer 130 fills the first recesses 111 and covers the substrate 100. As shown in the top view of FIG. 8, the capacitor contact pads 110 and the first recesses 111 are not exposed, the circles shown by the dotted line on the outside are the edges of the first surfaces of the capacitor contact pads 110, and the circles shown by the dotted line on the inside are the edges of the first recesses 111.

Referring to FIGS. 10 and 11, the first conductive layer 130 is formed, part of the first conductive layer 130 on the substrate 100 is removed, and the remaining part of the first conductive layer 130 forms a plurality of conductive pillars 120. As shown in FIGS. 10 and 11, a conductive pillar 120 is formed in each capacitor contact pad 110. Exemplarily, the part of the first conductive layer 130 on the substrate 100 may be removed by chemical-mechanical polishing (CMP).

Step S104, a plurality of capacitors are formed on the substrate, the plurality of capacitors and the plurality of the capacitor contact pads corresponding one to one and being electrically connected; wherein a first plate of each capacitor covers the conductive pillar in the corresponding capacitor contact pad, and the material of the first plates is the same as that of the conductive pillars.

A plurality of capacitors are formed on the substrate 100, and the plurality of the capacitors and the plurality of the capacitor contact pads 110 correspond one to one and are electrically connected. It may be understood that the number of capacitors is equal to the number of the capacitor contact pads 110, and each capacitor contact pad 110 is connected to a capacitor. The first plate of each capacitor covers the conductive pillar 120 in the corresponding capacitor contact pad 110, and the material of the first plates is the same as that of the conductive pillars 120. The area of lower end surfaces of the first plates may be 1.5 to 3 times that of upper end surfaces of the corresponding conductive pillars 120.

As such, the first plates and the conductive pillars 120 form wholes to form bottom plates of the capacitors, the conductive pillars 120 are disposed in the first contact pads, and the contact areas between the wholes formed by the first plates 810 and the conductive pillars 120 and the first contact pads increase, that is, the contact areas between the bottom plates of the capacitors and the first contact pads increase, thereby reducing the contact resistances between the capacitors and the first contact pads and improving the storage speed and storage efficiency of the memory.

In the method for manufacturing a memory provided by the embodiment of the present application, a substrate 100 is provided, a plurality of capacitor contact pads 110 being disposed at intervals in the substrate 100; a first recess 111 is formed on a first surface of each capacitor contact pad 110; conductive pillars 120 are formed in the first recesses 111, upper end surfaces of the conductive pillars 120 being flush with the first surfaces of the capacitor contact pads 110; and a plurality of capacitors are formed on the substrate 100, the plurality of the capacitors and the plurality of the capacitor contact pads 110 corresponding one to one and being electrically connected; wherein a first plate of each capacitor covers the conductive pillar 120 in the corresponding capacitor contact pad 110, and the material of the first plates is the same as that of the conductive pillars 120. The conductive pillars 120 are disposed in the capacitor contact pads, and the materials of the conductive pillars 120 and the first plates are the same, which increase the contact areas of the conductive pillars 120 and the first plates as wholes with the capacitor contact pads 110, and reduce the contact resistances between the capacitors and the capacitor contact pads 110, thereby improving the storage efficiency and storage speed.

Referring to FIGS. 12 to 33, in an embodiment of the present application, the step of forming a plurality of capacitors on the substrate, the plurality of the capacitors and the plurality of the capacitor contact pads 110 corresponding one to one and being electrically connected may include:

Step S1041, a barrier layer is formed on the substrate, the barrier layer covering the substrate, the capacitor contact pads and the conductive pillars.

Figure 13:
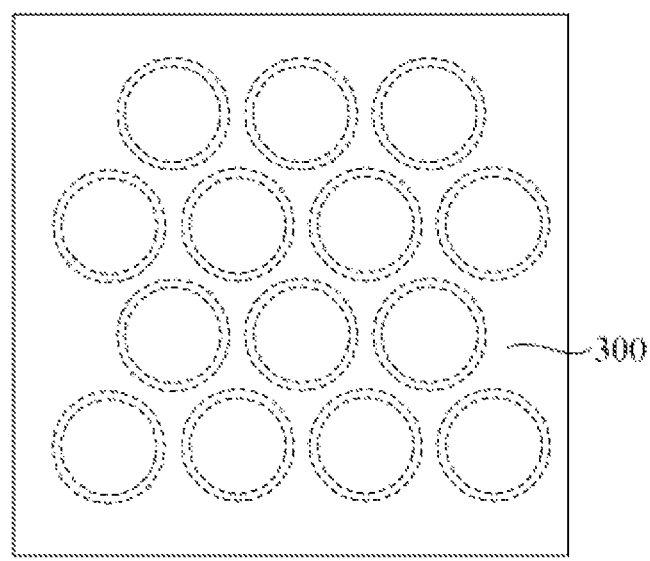
FIG. 13 is a top view after forming a barrier layer in an embodiment of the present application.
Figure 14:
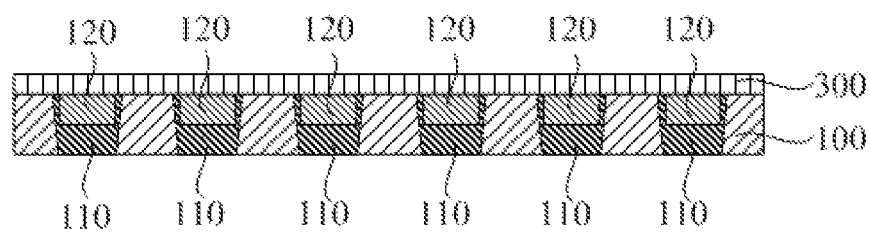
FIG. 14 is a schematic structure diagram after forming the barrier layer in an embodiment of the present application.

Referring to FIGS. 13 and 14, the barrier layer 300 may be formed on the substrate 100 by deposition. Exemplarily, the barrier layer 300 is formed on the substrate 100 by Chemical Vapor Deposition (CVD), Physical Vapor Deposition (PVD), or Atomic Layer Deposition (ALD), etc.

The material of the barrier layer 300 includes SiBN, and this layer may serve as an etching barrier layer to reduce or prevent damage to the substrate 100 in the subsequent manufacturing process. In addition, the barrier layer 300 has relatively excellent high temperature performance, relatively low dielectric constant and dielectric loss, and good insulation performance, to improve the performance of the memory.

It should be noted that, referring to FIG. 13, which is a top view after forming the barrier layer 300 in an embodiment of the present application, the barrier layer 300 covers the substrate 100, the capacitor contact pads 110 and the conductive pillars 120, so the capacitor contact pads 110 and the conductive pillars 120 are circles shown by the dotted lines in FIG. 13, the circles on the outside are the edges of the first surfaces of the capacitor contact pads 110, and the circles on the inside is the edges of the conductive pillars 120, that is, the conductive pillars 120 are located in the capacitor contact pads 110.

Step S1042, a second plate is formed on the barrier layer, the second plate being formed with a plurality of first hole structures, the plurality of the first hole structures being in one-to-one correspondence with the plurality of the capacitor contact pads.

Referring to FIGS. 15-22, the second plate 420 is formed with a plurality of first hole structures 410, the first hole structures 410 penetrate the second plate 420, and the first hole structures 410 may be formed by photolithography and etching. It may be understood that the second plate 420 is top plates of the capacitors.

The plurality of the first hole structures 410 being in one-to-one correspondence with the plurality of the capacitor contact pads 110 may be understood that the number of the first hole structures 410 is the same as that of the capacitor contact pads 110, and one first hole structure 410 corresponds to one capacitor contact pad 110, for example, the first hole structures 410 are located above the corresponding capacitor contact pads 110.

The size of the first hole structures 410 may be greater than that of the first surfaces of the capacitor contact pads 110, for example, the orthographic projections of the first hole structures 410 on the substrate 100 cover the first surfaces of the capacitor contact pads 110, which facilitates the subsequent formation of a dielectric layer 600 and the second plate 420 in the first hole structures 410.

Figure 15:
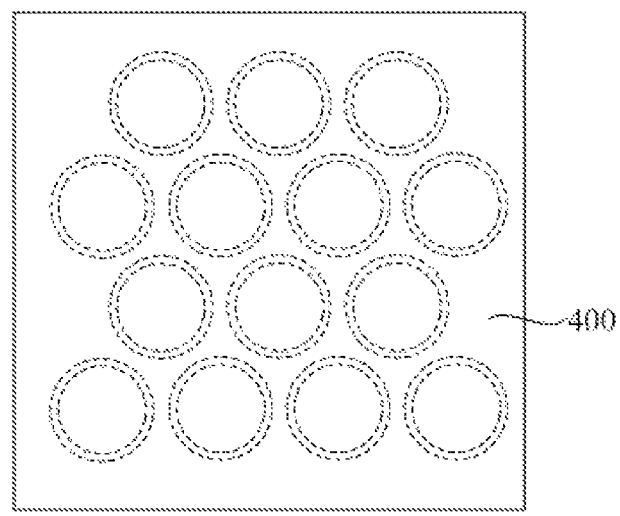
FIG. 15 is a top view after forming a first electrode layer in an embodiment of the present application.
Figure 16:
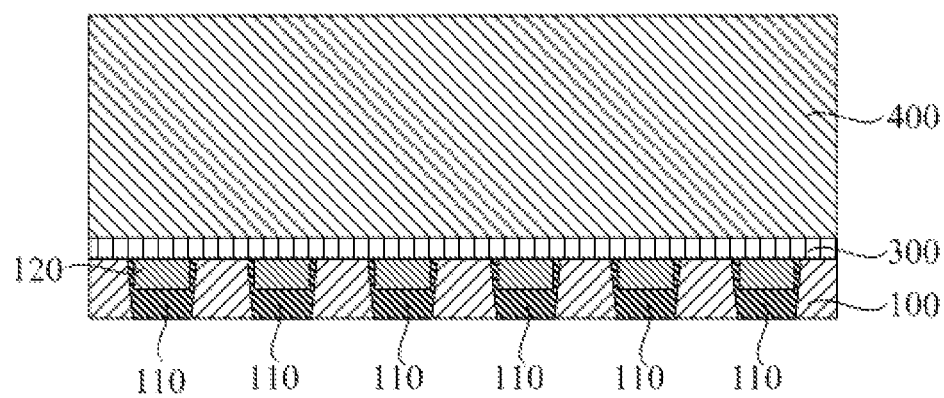
FIG. 16 is a schematic structure diagram after forming the first electrode layer in an embodiment of the present application.

In some possible examples, the forming a second plate on the barrier layer, the second plate being formed with a plurality of first hole structures, the plurality of the first hole structures being in one-to-one correspondence with the plurality of the capacitor contact pads may include:

A first electrode layer 400 is formed on the barrier layer 300. Referring to FIGS. 15 and 16, the first electrode layer 400 may be formed on the barrier layer 300 by deposition, that is, the first electrode layer 400 covers the barrier layer 300, and the material of the first electrode layer 400 may include titanium nitride (TiN).

After the first electrode layer 400 is formed, a hard mask layer 520 is formed on the first electrode layer 400, the hard mask layer 520 being formed with a plurality of etching holes 510, and the plurality of the etching holes 510 being in one-to-one correspondence with the plurality of the capacitor contact pads 110. Referring to FIGS. 17-20, the hard mask layer 520 is formed with a plurality of etching holes 510, the etching holes 510 penetrate the hard mask layer 520, and the plurality of the etching holes 510 are in one-to-one correspondence with the plurality of the capacitor contact pads 110.

Figure 17:
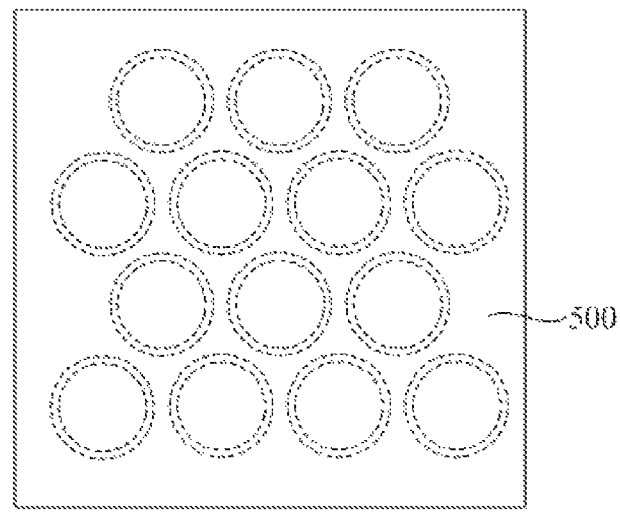
FIG. 17 is a top view after forming a preset mask layer in an embodiment of the present application.
Figure 18:
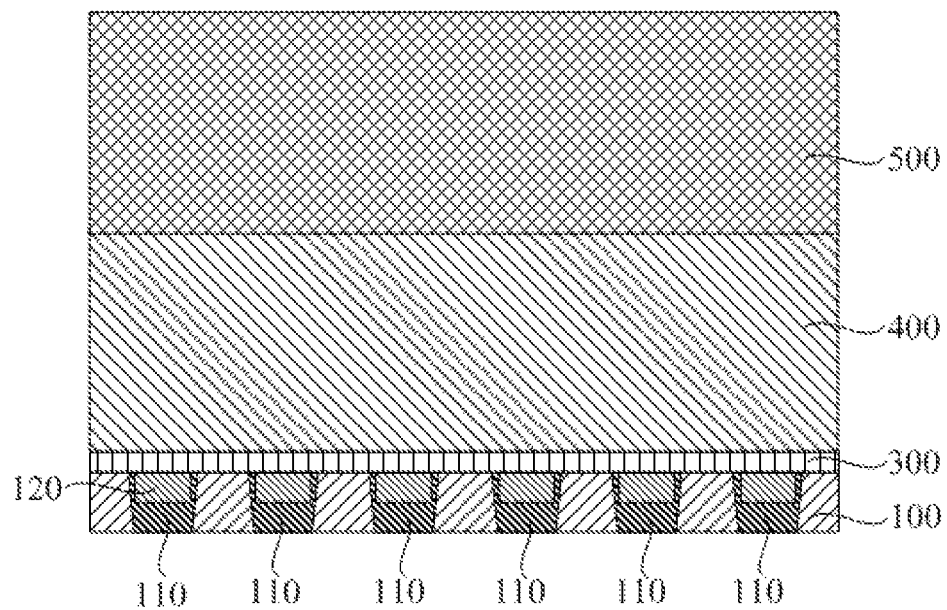
FIG. 18 is a schematic structure diagram after forming the preset mask layer in an embodiment of the present application.
Figure 19:
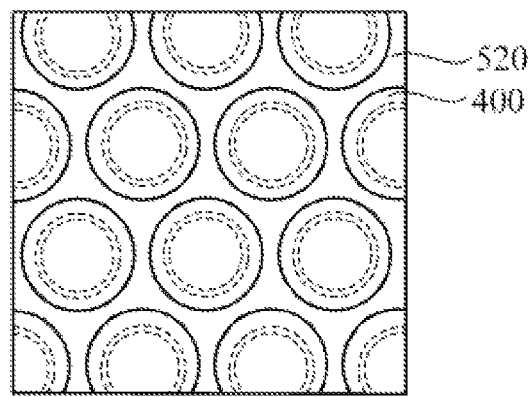
FIG. 19 is a top view after forming a hard mask layer in an embodiment of the present application.
Figure 20:
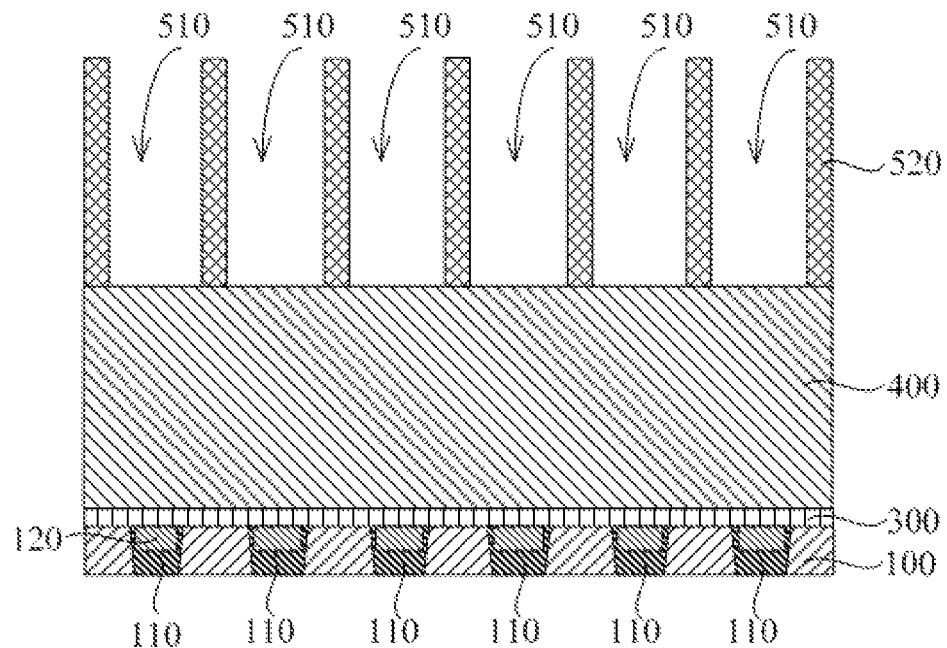
FIG. 20 is a schematic structure diagram after forming the hard mask layer in an embodiment of the present application.

Exemplarily, referring to FIGS. 17 and 18, a preset mask layer 500 is deposited on the first electrode layer 400; then referring to FIGS. 19 and 20, the preset mask layer 500 is etched to form the etching holes 510, the preset mask layer 500 with the etching holes 510 being the hard mask layer 520.

The etching holes 510 may be formed by Self-aligned Double Patterning (SADP), Self-aligned Quadruple Patterning, or EUV (Extreme Ultraviolet) photolithography. As shown in the top view of FIG. 19, the first electrode layer 400 is exposed in the etching holes 510, and the capacitor contact pads 110 and the conductive pillars 120 are still shown by the dotted line in FIG. 19 and are not exposed.

Figure 21:
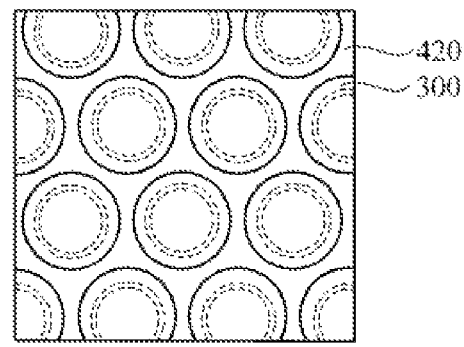
FIG. 21 is a top view after forming first hole structures in an embodiment of the present application.
Figure 22:
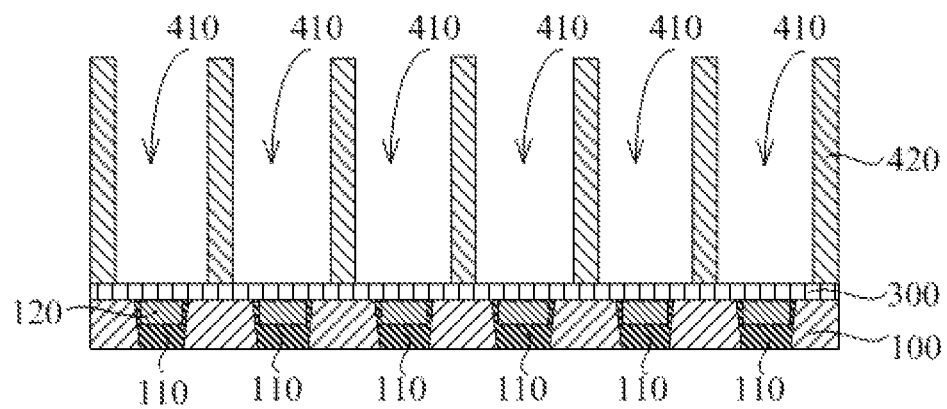
FIG. 22 is a schematic structure diagram after forming the first hole structures in an embodiment of the present application.

The hard mask layer 520 is formed, and the first electrode layer 400 is etched along the etching holes 510 to form the first hole structures 410. Referring to FIGS. 21 and 22, the first electrode layer 400 is etched using the hard mask layer 520 as a mask to form the first hole structures 410 in the first electrode layer 400.

Through the etching process, the pattern on the hard mask layer 520 is transferred to the first electrode layer 400 to form the second plate 420 with the first hole structures 410. As shown in the top view of FIG. 21, part of the barrier layer 300 is exposed, and the capacitor contact pads 110 and the conductive pillars 120 are still shown by the dotted line in FIG. 21 and are not exposed. As such, the second plate 420 may be formed by etching at one time, and the capacitors are interconnected through the second plate 420. The second plate 420 is first formed, and the second plate 420 supports the dielectric layer 600 and the first plates 810 subsequently formed, with a relatively large support area, which facilitates the formation of capacitors with relatively large depth-width ratios, that is, the stability of the capacitors is good, and the yield of the memory is improved.

After the first hole structures 410 are formed, the hard mask layer 520 is removed. As shown in FIGS. 21 and 22, the hard mask has been removed, and the second plate 420 is exposed, so that the dielectric layer 600 is formed on the upper surface and side surface of the second plate 420.

Step S1043, a dielectric layer is formed on the walls of the first hole structures, the dielectric layer enclosing second hole structures, the second hole structures extending to the capacitor contact pads.

Referring to FIGS. 23-29, a dielectric layer 600 is formed on the walls of the first hole structures 410. The dielectric layer 600 may be a high dielectric constant layer, so that this layer has better insulation performance. The dielectric layer 600 in the first hole structures 410 encloses second hole structures 610, and the second hole structures 610 extend to the capacitor contact pads 110. That is, the second hole structures 610 also penetrate the barrier layer 300 to expose the capacitor contact pads 110 and the conductive pillars 120 in the second hole structures 610.

Figure 23:
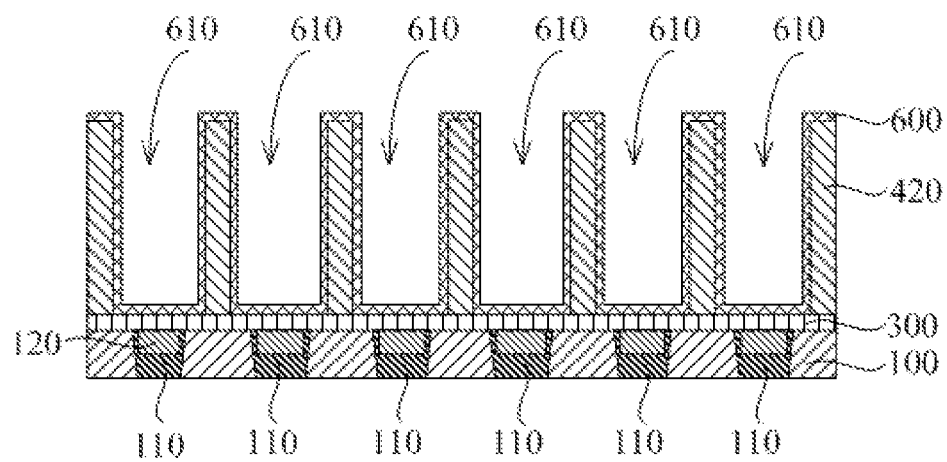
FIG. 23 is a schematic structure diagram after forming a dielectric layer in an embodiment of the present application.

In some possible examples, referring to FIG. 23, the forming a dielectric layer on the walls of the first hole structures may include:

A dielectric layer 600 is deposited on the walls and bottoms of the first hole structures 410 and on the second plate 420, part of the dielectric layer 600 in the first hole structures 410 enclosing second hole structures 610. During the formation of the dielectric layer 600, the second plate 420 supports the dielectric layer 600 with a relatively large support area, which is beneficial to increasing the deposition area of the dielectric layer 600 and improving the deposition quality of the dielectric layer 600.

After the dielectric layer 600 is formed, part of the dielectric layer 600 on the walls of the first hole structures 410 is retained, the remaining part of the dielectric layer 600 is removed, and the second hole structures 610 expose the barrier layer 300. It is understandable that part of the dielectric layer 600 on the surface of the second plate 420 away from the substrate 100 and part of the dielectric layer 600 at the bottoms of the second hole structures 610 are removed, and part of the dielectric layer 600 on the walls of the first hole structures 410 is retained.

Part of the dielectric layer 600 on the walls of the first hole structures 410 is retained, and after the remaining part of the dielectric layer 600 is removed, part of the barrier layer 300 is removed to expose the capacitor contact pads 110 and the conductive pillars 120 in the second hole structures 610. Exemplarily, the barrier layer 300 is etched along the second hole structures 610, so that the second hole structures 610 penetrate the barrier layer 300 and extend to the capacitor contact pads 110.

Figure 24:
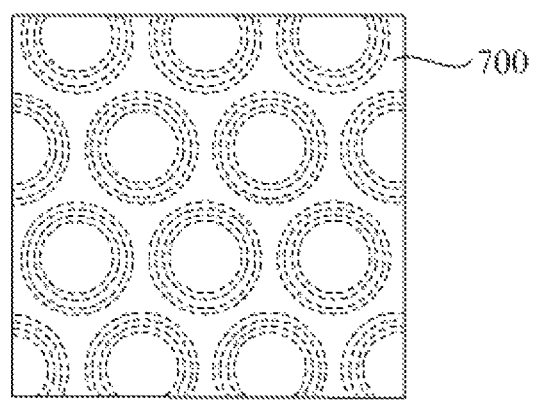
FIG. 24 is a top view after forming a protective layer in an embodiment of the present application.
Figure 25:
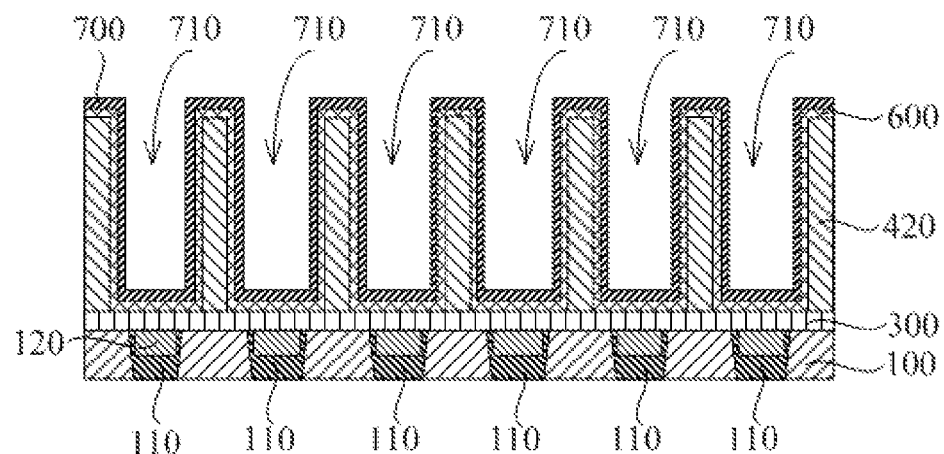
FIG. 25 is a schematic structure diagram after forming the protective layer in an embodiment of the present application.

In other possible examples, referring to FIGS. 24 to 29, the forming a dielectric layer 600 on the walls of the first hole structures 410 may include:

Referring to FIGS. 24 and 25, the dielectric layer 600 is deposited on the walls and bottoms of the first hole structures 410 and on the second plate 420, part of the dielectric layer 600 in the first hole structures 410 enclosing second hole structures 610. As shown in FIGS. 24 and 25, the dielectric layer 600 covers the second plate 420.

Continuing to refer to FIGS. 24 and 25, after the dielectric layer 600 is formed, a protective layer 700 is deposited on the dielectric layer 600, part of the protective layer 700 in the second hole structures 610 enclosing third hole structures 710. As shown in FIGS. 24 and 25, the protective layer 700 covers the dielectric layer 600, and the material of the protective layer 700 may be a conductive material. Exemplarily, the material of the protective layer 700 may be the same as that of the first plates 810 subsequently formed, that is, the protective layer 700 and the first plates 810 together form the bottom plates of the capacitors.

It should be noted that, referring to the top view shown in FIG. 24 after the protective layer 700 is formed, among four circles sleeved in sequence, the circles shown by the dotted line on the outermost side are parts of the edge of the second plate 420, the circles shown by the dotted line on the second outer side are parts of the edge of the dielectric layer 600, the circles shown by the dotted line on the innermost side are the edges of the conductive pillars 120, the circles shown by the dotted line on the second inner side are the edges of the first surfaces of the capacitor contact pads 110, and the third hole structures 710 are not marked in the top view.

Figure 26:
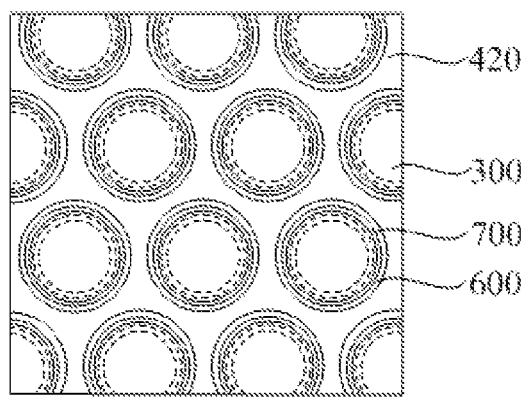
FIG. 26 is a top view after exposing the barrier layer in an embodiment of the present application.
Figure 27:
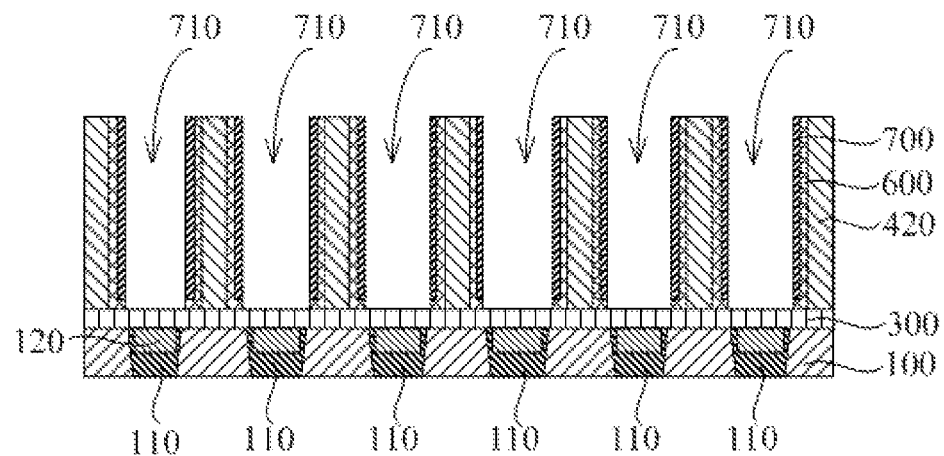
FIG. 27 is a schematic structure diagram after exposing the barrier layer in an embodiment of the present application.

Referring to FIGS. 26 and 27, after the protective layer 700 is formed, the bottoms of the third hole structures 710, and part of the protective layer 700 and part of the dielectric layer 600 on the second plate 420 are removed, and the third hole structures 710 expose the barrier layer 300. As shown in FIGS. 26 and 27, the protective layer 700 and the dielectric layer 600 are etched along the third hole structures 710, so that the barrier layer 300 is exposed in the third hole structures 710. While part of the protective layer 700 and part of the dielectric layer 600 at the bottoms of the third hole structures 710 are etched, part of the protective layer 700 and part of the dielectric layer 600 on the surface of the second plate 420 away from the substrate 100 are also etched to expose the second plate 420.

It should be noted that, referring to the top view shown in FIG. 26, the second plate 420 is exposed, the circles shown by the solid line on the outermost side are parts of the edge of the second plate 420, the circles shown by the solid line on the second outer side are parts of the edge of the dielectric layer 600, and the circles shown by the solid line on the innermost side are parts of the edge of the protective layer 700. That is, parts of the dielectric layer 600 are located between the circles shown by the solid line on the outermost side and the circles shown by the solid line on the second outer side, parts of the protective layer 700 are located between the circles shown by the solid line on the second outer side and the circles shown by the solid line on the innermost side, and the parts of the protective layer 700 covers the capacitor contact pads 110 and the conductive pillars 120, that is, the capacitor contact pads 110 and the conductive pillars 120 are circles shown by the dotted line in FIG. 26 and are not exposed.

Figure 28:
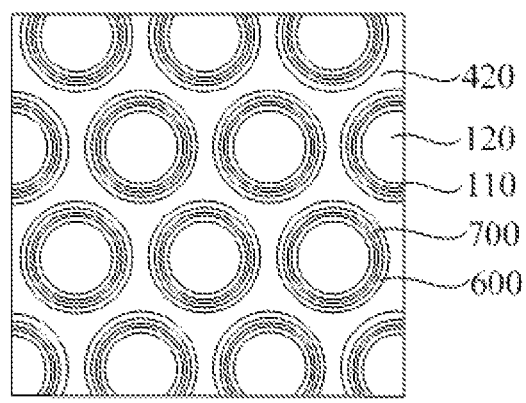
FIG. 28 is a top view after removing part of the barrier layer in an embodiment of the present application.
Figure 29:
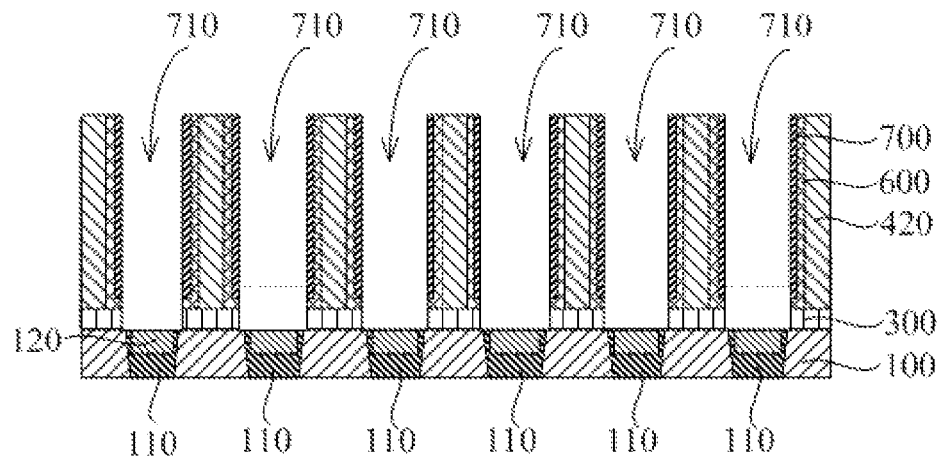
FIG. 29 is a schematic structure diagram after removing part of the barrier layer in an embodiment of the present application.

Referring to FIGS. 28 and 29, after the barrier layer 300 is exposed, part of the barrier layer 300 is removed to expose the capacitor contact pads 110 and the conductive pillars 120 in the third hole structures 710. As shown in FIGS. 28 and 29, the barrier layer 300 is etched along the third hole structures 710 to expose the capacitor contact pads 110 and the conductive pillars 120. That is, the third hole structures 710 penetrate the barrier layer 300 and extend to the capacitor contact pads 110.

Step S1044, first plates are formed in the second hole structures, the first plates being electrically connected to the capacitor contact pads and covering the conductive pillars.

Referring to FIGS. 30 to 33, the first plates 810 are made of a conductive material and are in contact with the capacitor contact pads 110 to achieve electrical connection between the first plates 810 and the capacitor contact pads 110. The first plates 810 are formed in the second hole structures 610. The first plates 810 do not require any support strength, and can thus be made of a material with good compatibility with the dielectric layer 600 and high work function. Exemplarily, the material of the first plates 810 may include titanium nitride (TiN) or a mixture of titanium nitride and tungsten.

The first plates 810 cover the conductive pillars 120. Exemplarily, the area of lower end surfaces of the first plates 810 is 1.5 to 3 times that of upper end surfaces of the corresponding conductive pillars 120. The material of the first plates 810 is the same as that of the conductive pillars 120. After the first plates 810 are formed, the first plates 810 and the conductive pillars 120 as wholes form bottom plates of the capacitors. The conductive pillars 120 are formed in the capacitor contact pads 110, to increase the contact areas between the bottom plates of the capacitors and the capacitor contact pads 110 and reduce the contact resistances between the capacitors and the capacitor contact pads 110, thereby improving the storage efficiency and storage speed. As such, the areas of the bottom plates of the capacitors also increase.

Figure 30:
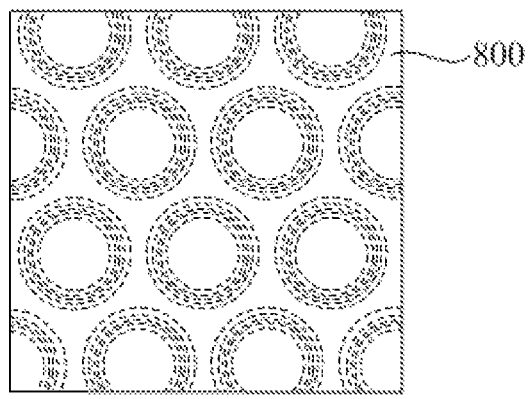
FIG. 30 is a top view after forming a second electrode layer in an embodiment of the present application.
Figure 31:
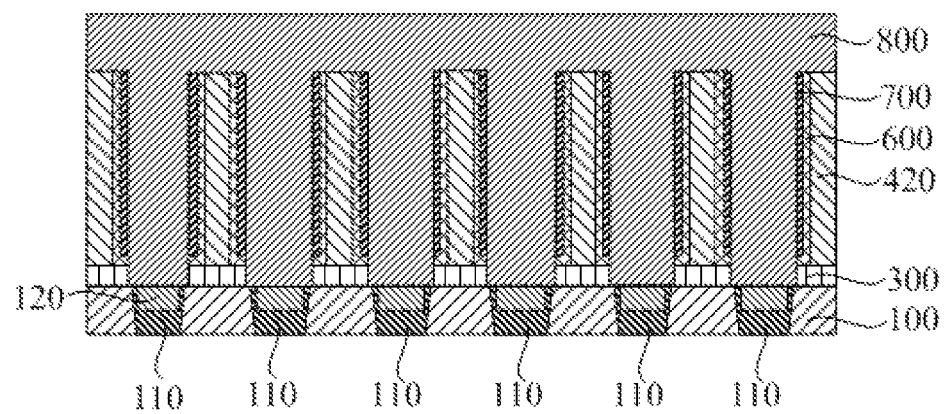
FIG. 31 is a schematic structure diagram after forming the second electrode layer in an embodiment of the present application.

When the protective layer 700 is formed on the dielectric layer 600, the forming first plates 810 in the second hole structures 610 may specifically include:

Referring to FIGS. 30 and 31, a second electrode layer 800 is formed in the third hole structures 710 and on the protective layer 700, the dielectric layer 600 and the second plate 420, and the second electrode layer 800 is in contact with the capacitor contact pads 110. As shown in FIGS. 30 and 31, the second electrode layer 800 fills the third hole structures 710 and covers the first plates 810, the protective layer 700 and the dielectric layer 600.

Figure 32:
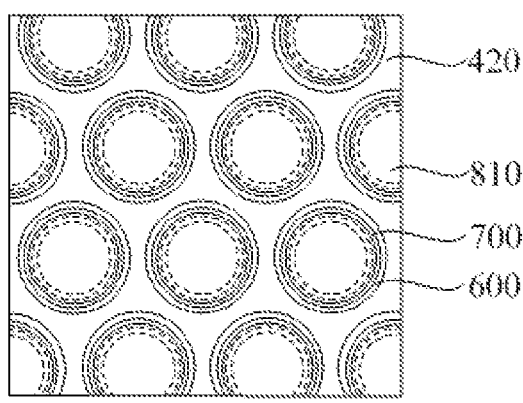
FIG. 32 is a top view after forming first plates in an embodiment of the present application.
Figure 33:
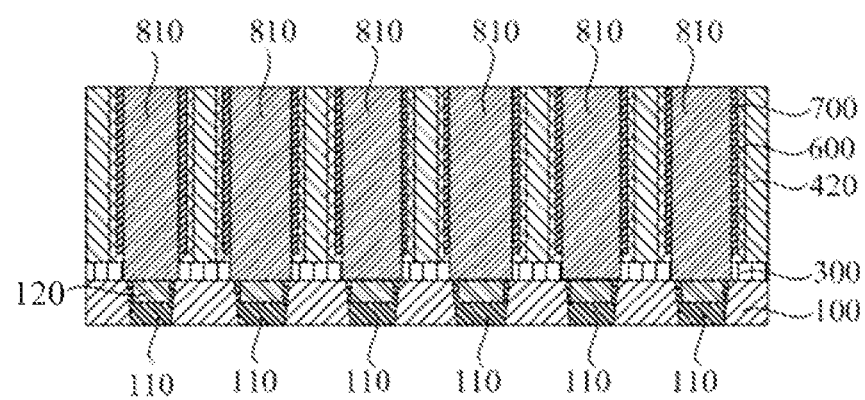
FIG. 33 is a schematic structure diagram after forming the first plates in an embodiment of the present application.

Referring to FIGS. 32 and 33, after the second electrode layer 800 is formed, part of the second electrode layer 800 on the dielectric layer 600 and the second plate 420 is removed, and the remaining part of the second electrode layer 800 forms the first plates 810.

As shown in FIGS. 32 and 33, part of the second electrode layer 800 in the third hole structures 710 is retained, the remaining part of the second electrode layer 800 forms the first plates 810, the number of the first plates 810 is plural, and one first plate 810 is formed in each third hole structure 710. Exemplarily, part of the second electrode layer 800 may be removed by etching, that is, the second electrode layer 800 is deposited and etched back to form a plurality of separate first plates 810.

Figure 34:
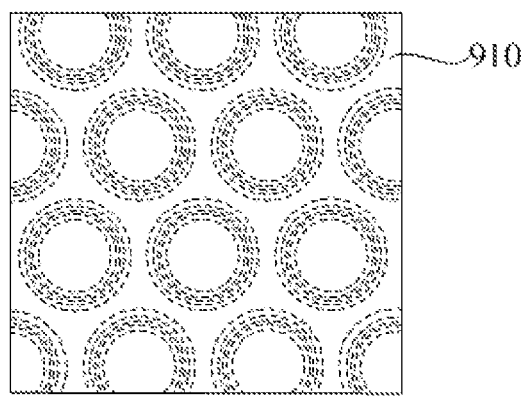
FIG. 34 is a top view after forming an insulating layer in an embodiment of the present application.
Figure 35:
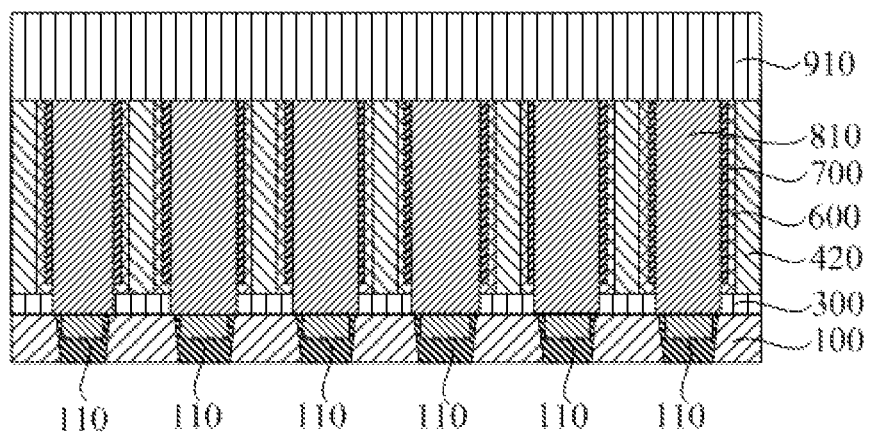
FIG. 35 is a schematic structure diagram after forming the insulating layer in an embodiment of the present application.

It should be noted that, referring to FIGS. 34 to 40, after the forming a plurality of capacitors on the substrate 100, the plurality of the capacitors and the plurality of the capacitor contact pads 110 corresponding one to one and being electrically connected, the method further includes:

Referring to FIGS. 34 and 35, an insulating layer 910 is formed on the second plate 420, the dielectric layer 600 and the first plate 810. The insulating layer 910 covers the first plates 810, the dielectric layer 600 and the second plate 420. The first plates 810, the dielectric layer 600 and the second plate 420 are shown by the dotted lines in FIG. 34 and are not exposed. The material of the insulating layer 910 may include silicon dioxide.

Figure 36:
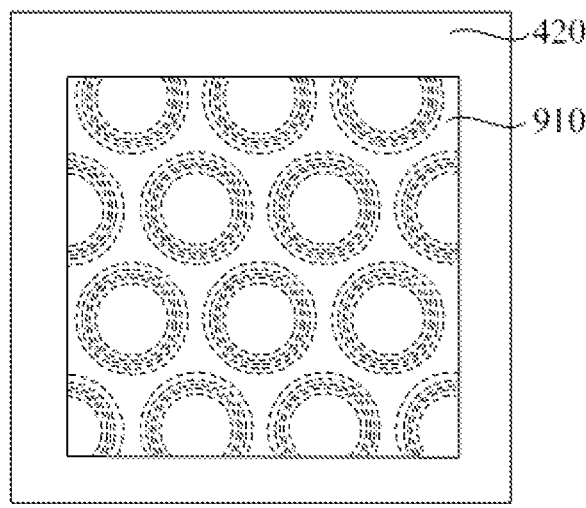
FIG. 36 is a top view after removing part of the insulating layer in an embodiment of the present application.
Figure 37:
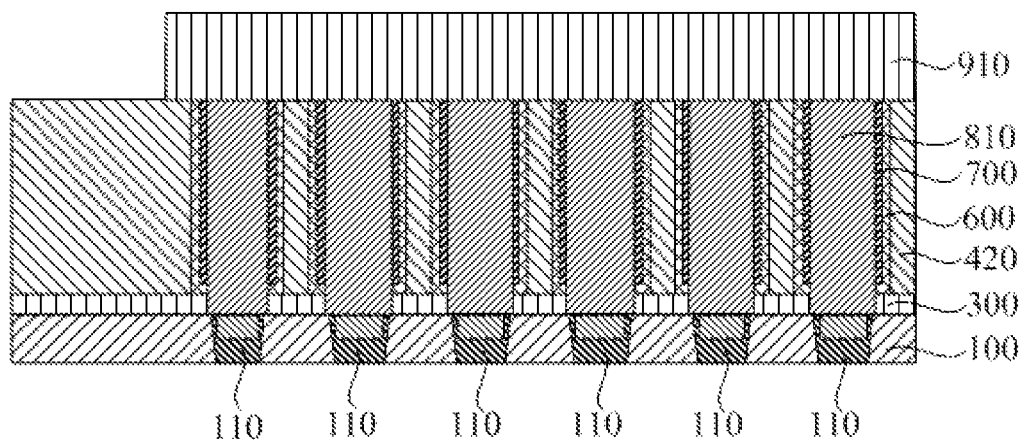
FIG. 37 is a schematic structure diagram after removing part of the insulating layer in an embodiment of the present application.

Referring to FIGS. 36 and 37, after the insulating layer 910 is formed, part of the insulating layer 910 is removed to expose part of the second plate 420, and the remaining part of the insulating layer 910 covers the first plates 810. As shown in FIGS. 36 and 37, part of the insulating layer 910 above the edge of the second plate 420 is removed to expose part of the second plate 420, thereby electrically connecting the second plate 420 with other structures. The remaining part of the insulating layer 910 covers the first plates 810 so as to electrically isolate the first plates 810 from each other. The first plates 810 and the dielectric layer 600 are dotted lines in the top view shown in FIG. 34 and are not exposed.

Figure 38:
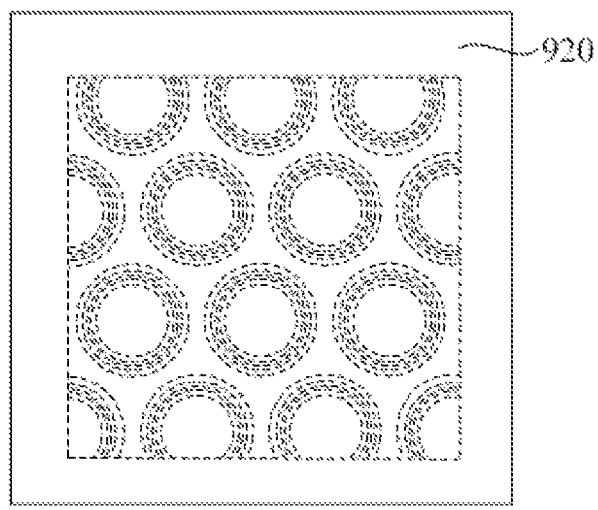
FIG. 38 is a top view after forming a second conductive layer in an embodiment of the present application.
Figure 39:
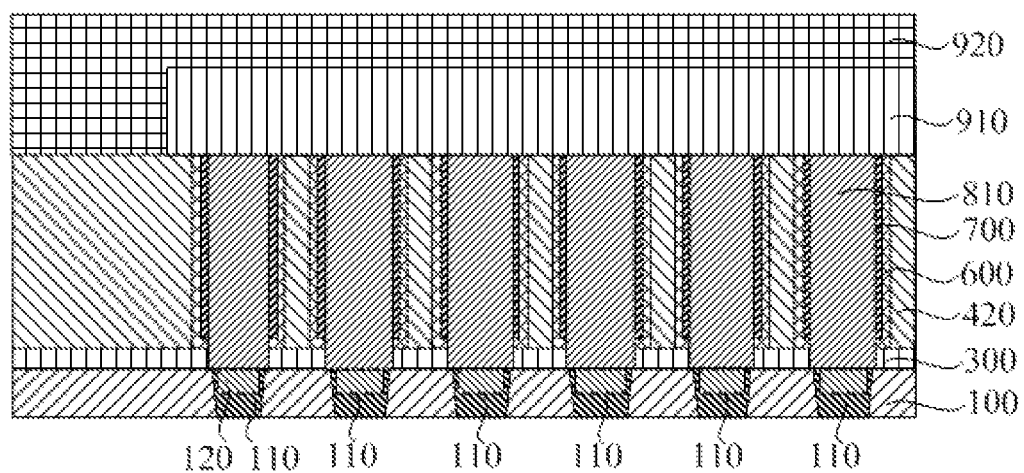
FIG. 39 is a schematic structure diagram after forming the second conductive layer in an embodiment of the present application.

Referring to FIGS. 38 and 39, after part of the insulating layer 910 is removed, a second conductive layer 920 is formed on the second plate 420 and the insulating layer 910. As shown in FIGS. 38 and 39, the second conductive layer 920 is deposited on the first plates 810 and the insulating layer 910. The material of the second conductive layer 920 may include tungsten, silicon germanium (SiGe), or a mixture of tungsten and silicon germanium. The first plates 810, the dielectric layer 600, the second plate 420 and the insulating layer 910 are dotted lines in the top view shown in FIG. 38 and are not exposed. The second plate 420 is electrically connected to other structures by the second conductive layer 920. For example, as shown in FIG. 41, a M1 metal layer 930 is electrically connected to the second plate 420 by the second conductive layer 920.

Figure 40:
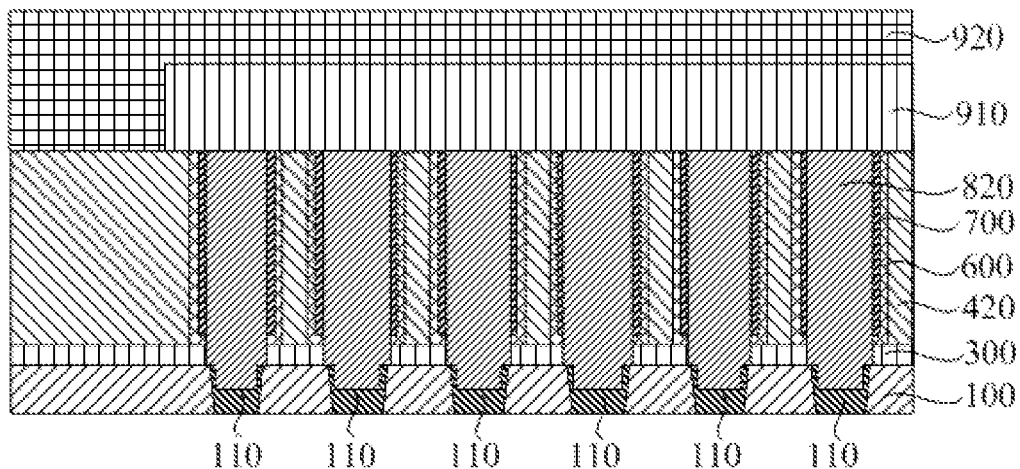
FIG. 40 is a schematic structure diagram of bottom plates of capacitors in an embodiment of the present application.

Referring to FIG. 40, the first plates 810 and the conductive pillars 120 are made of the same material and form bottom plates 820 as shown in FIG. 40, the contact areas between the bottom plates 820 and the capacitor contact pads 110 increase, and the areas of the bottom plates 820 also increase.

Figure 41:
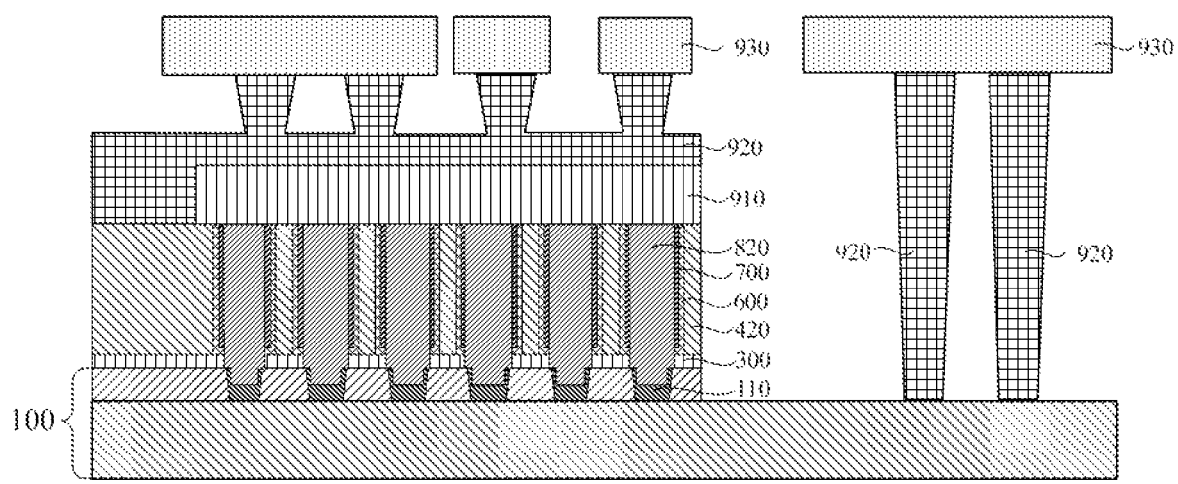
FIG. 41 is a schematic structure diagram after forming a M1 metal layer in an embodiment of the present application.

It should be noted that, referring to FIG. 41, the substrate 100 includes a core region and a peripheral region, capacitors are formed on the core region of the substrate 100, and a peripheral circuit is formed on the peripheral region of the substrate 100. The second conductive layer 920 covers the second plate 420 and the insulating layer 910, and the second conductive layer 920 also covers the peripheral region of the substrate 100. Part of the second conductive layer 920 is removed by etching, to disconnect the second conductive layer 920 on the core region of the substrate 100 and on the peripheral region of the substrate 100, and to form the peripheral circuit on the peripheral region of the substrate 100. The second conductive layer 920 may be electrically connected to the M1 metal layer 930.

Referring to FIGS. 38 to 41, the memory in the embodiment of the present application includes a substrate 100 and capacitors disposed on the substrate 100, and a plurality of capacitor contact pads 110 are disposed at intervals in the substrate 100. The capacitor contact pads 110 are exposed on the surface of the substrate 100, so as to be electrically connected to the capacitors subsequently formed.

The number of the capacitor contact pads 110 may be plural, the capacitor contact pads 110 are disposed at intervals, and each capacitor contact pad 110 is in contact with one of the capacitors subsequently formed to control the capacitor to read or output data. The capacitor contact pads 110 are arranged in an array, for example, the capacitor contact pads 110 are arranged in a honeycomb shape in the substrate 100.

A conductive pillar 120 is disposed in each capacitor contact pad 110. Exemplarily, first recesses are formed on first surfaces of the capacitor contact pads 110, and the conductive pillar s120 fill the first recesses. As shown in FIGS. 38 and 39, the first recesses are formed on the upper surfaces of the capacitor contact pads 110. The upper end surfaces of the conductive pillars 120 may be flush with the first surfaces of the capacitor contact pads 110, the area of the upper end surfaces of the conductive pillars 120 is ⅓ to ½ of the area of the first surfaces of the capacitor contact pads 110, and the height of the conductive pillars 120 may be ⅓ to ⅔ of the height of the capacitor contact pads 110.

A barrier layer 300 is further disposed on the substrate 100. The material of the barrier layer 300 includes SiBN. On the one hand, the barrier layer 300 can reduce or prevent damage to the substrate 100 in the subsequent manufacturing process; and on the other hand, the barrier layer 300 has relatively excellent high temperature performance, relatively low dielectric constant and dielectric loss, and good insulation performance.

Continuing to refer to FIGS. 38 and 39, the capacitors includes first plates 810, a second plate 420, and a dielectric layer 600 disposed between the first plates 810 and the second plate 420. The material of the second plate 420 may include titanium nitride, and the first plates 810 may be made of a material with good compatibility with the dielectric layer 600 and high work function, for example, the material of the first plates 810 may include titanium nitride or a mixture of titanium nitride and tungsten.

The second plate 420 is provided with a plurality of first hole structures, the plurality of the first hole structures correspond to the plurality of the capacitor contact pads 110 one to one, and the orthographic projections of the first hole structures 410 on the substrate 100 cover the first surfaces of the capacitor contact pads 110, so that there are enough spaces in the first hole structures 410 for forming the dielectric layer 600 and the first plates 810.

The dielectric layer 600 is disposed on the walls of the first hole structures 410, and the dielectric layer 600 encloses second hole structures 610. As shown in FIGS. 38 and 39, the dielectric layer 600 covers the walls of the first hole structures 410, and the dielectric layer 600 may be a high dielectric constant (High-K) layer, so that this layer has better insulation performance.

In a possible example, as shown in FIGS. 38 and 39, the capacitors further includes a protective layer 700, the protective layer 700 is disposed on the walls of the second hole structures 610, and part of the protective layer 700 in the second hole structures 610 enclose third hole structures 710. The protective layer 700 may be made of a conductive material. For example, the material of the protective layer 700 may be the same as that of the first plates 810.

The third hole structures extend to the substrate 100 to expose the capacitor contact pads 110. That is, the third hole structures penetrate the barrier layer 300 to expose the capacitor contact pads 110 in the third hole structures, so that the first plates 810 in the third holes are in contact with the capacitor contact pads 110.

The first plates 810 are disposed in the second hole structures 610, and the first plates 810 are electrically connected to the capacitor contact pads 110, so that the capacitors is electrically connected to the capacitor contact pads 110. The first plates 810 cover the corresponding conductive pillars 120.

Exemplarily, the area of lower end surfaces of the first plates 810 is 1.5 to 3 times that of upper end surfaces of the corresponding conductive pillars 120. The material of the first plates 810 is the same as that of the conductive pillars 120. After the first plates 810 are formed, the first plates 810 and the conductive pillars 120 as wholes form bottom plates 820 of the capacitors as shown in FIG. 40. The conductive pillars 120 are formed in the capacitor contact pads 110, to increase the contact areas between the bottom plates 820 of the capacitors and the capacitor contact pads 110 and reduce the contact resistances between the capacitors and the capacitor contact pads 110, thereby improving the storage efficiency and storage speed. As such, the areas of the bottom plates 820 of the capacitors also increase.

When the capacitors include the protective layer 700, the protective layer 700 encloses third hole structures, and the first plates 810 fills the third hole structures, that is, the protective layer 700 is disposed between the dielectric layer 600 and the first plates 810.

The number of the first plates 810 is plural, and each first plate 810 is disposed in a third hole structure to electrically isolate the first plates 810, and the capacitors are interconnected by the second plate 420. The second plate 420 is first formed, and the second plate 420 supports the dielectric layer 600 and the first plates 810 subsequently formed, with a relatively large support area, which facilitates the formation of capacitors with relatively large depth-width ratios, that is, the stability of the capacitors is good, and the yield of the memory is improved.

As shown in FIGS. 38 and 39, an insulating layer 910 is further disposed on the capacitors, the insulating layer 910 covers the first plates 810 to ensure insulation between the first plates 810, and the insulating layer 910 covers part of the second plate 420, for example, the insulating layer 910 exposes the edge region of the second plate 420, so that the second plate 420 is electrically connected to other structures.

A second conductive layer 920 is disposed on the insulating layer 910 and the second plate 420, and the second conductive layer 920 is electrically connected to the second plate 420 to realize the electrical connection between the second plate 420 and other structures such as a M1 metal layer 930.

It should be noted that, referring to FIG. 41, the substrate 100 includes a core region and a peripheral region, capacitors are formed on the core region of the substrate 100, and a peripheral circuit is formed on the peripheral region of the substrate 100. The second conductive layer 920 covers the second plate 420 and the insulating layer 910, the second conductive layer 920 further covers the peripheral region of the substrate 100, and the second conductive layer 920 forms the peripheral circuit by etching.

The memory provided by the embodiment of the present application includes a substrate 100 and capacitors disposed on the substrate 100, a plurality of capacitor contact pads 110 are disposed at intervals in the substrate 100, and a conductive pillar 120 is disposed in each capacitor contact pad 110. The capacitors include a second plate 420, a dielectric layer 600 and first plates 810, wherein the second plate 420 is provided with a plurality of first hole structures, and the plurality of the first hole structures and the plurality of the capacitor contact pads 110 correspond one to one; the dielectric layer 600 is disposed on the walls of the first hole structures, and part of the dielectric layer 600 in the first hole structures encloses second hole structures; the first plates 810 are disposed in the second hole structures, the first plates 810 is electrically connected to the capacitor contact pads 110 and cover the corresponding conductive pillars 120, and the material of the conductive pillars 120 is the same as that of the first plates 810. The conductive pillars 120 are disposed in the capacitor contact pads 110, and the material of the conductive pillars 120 is the same as that of the first plates 810, thereby increasing the contact areas of the conductive pillars 120 and the first plates 810 as wholes with the capacitor contact pads 110, that is, increasing the contact areas between the bottom plates 820 of the capacitors and the capacitor contact pads 110, reducing the contact resistances between the capacitors and the capacitor contact pads 110, and improving storage efficiency and storage speed.

The embodiments or implementations in this specification are described in a progressive manner, each embodiment focuses on the differences from other embodiments, and the same or similar parts between the various embodiments may be referred to each other.

In the description of this specification, the descriptions with reference to the terms "one embodiment", "some embodiments", "exemplary embodiment", "example", "specific example", or "some examples", etc. mean that specific features, structures, materials or characteristics described in conjunction with the embodiments or examples are included in at least one embodiment or example of the present application. In this specification, the schematic descriptions of the above terms do not necessarily refer to the same embodiment or example. Moreover, the described specific features, structures, materials or characteristics may be combined in an appropriate manner in any one or more embodiments or examples.

Finally, it should be noted that the above embodiments are merely intended to describe, but not to limit, the technical solutions of the present application. Although the present application is described in detail with reference to the above embodiments, those of ordinary skill in the art should understand that various modifications may be made to the technical solutions described in the foregoing embodiments or equivalent substitutions may be made to some or all technical features thereof, and these modifications or substitutions do not make the essences of the corresponding technical solutions depart from the scope of the technical solutions of the embodiments of the present application.

The invention claimed is:

1. A method for manufacturing a memory, comprising:
providing a substrate, a plurality of capacitor contact pads being disposed at intervals in the substrate;
forming a first recess on a first surface of each of the capacitor contact pads;
forming conductive pillars in the first recesses, upper end surfaces of the conductive pillars being flush with the first surfaces of the capacitor contact pads;
forming a barrier layer on the substrate, the barrier layer covering the substrate, the capacitor contact pads and the conductive pillars;
forming a second plate on the barrier layer, the second plate being formed with a plurality of first hole structures, the plurality of the first hole structures being in one-to-one correspondence with the plurality of the capacitor contact pads;

depositing a dielectric layer on walls and bottoms of the first hole structures and on the second plate, part of the dielectric layer in the first hole structures enclosing the second hole;

depositing a protective layer on the dielectric layer, part of the protective layer in second hole structures enclosing third hole structures;

removing part of the protective layer and part of the dielectric layer at bottoms of the third hole structures, and removing part of the protective layer and part of the dielectric layer on the second plate, so that the third hole structures expose the barrier layer;

removing part of the barrier layer, to expose the capacitor contact pads and the conductive pillars in the third hole structures;

forming first plates in the third hole structures, the first plates being electrically connected to the capacitor contact pads and covering the conductive pillars; and forming a plurality of capacitors composited by the second plate, the dielectric layer and the first plates, the plurality of the capacitors and the plurality of the capacitor contact pads corresponding one to one and being electrically connected, and a material of the first plates is the same as a material of the conductive pillars.

2. The method for manufacturing a memory of claim 1, wherein an opening area of the first recesses is ⅓ to ½ of an area of the first surfaces of the capacitor contact pads.

3. The method for manufacturing a memory of claim 1, wherein a depth of the first recesses is ⅓ to ⅖ of a thickness of the capacitor contact pads.

4. The method for manufacturing a memory of claim 1, wherein an area of lower end surfaces of the first plates is 1.5 to 3 times an area of upper end surfaces of the corresponding conductive pillars.

5. The method for manufacturing a memory of claim 1, wherein the forming conductive pillars in the first recesses comprises:

depositing a conductive material in the first recesses and on the substrate to form a first conductive layer; and removing part of the first conductive layer on the substrate, remaining part of the first conductive layer forming a plurality of the conductive pillars.

6. The method for manufacturing a memory of claim 5, wherein the part of the first conductive layer on the substrate is removed by chemical-mechanical polishing.

7. The method for manufacturing a memory of claim 1, wherein the forming a first recess on a first surface of each of the capacitor contact pads comprises:

forming a photoresist layer on the substrate, the photoresist layer having a first pattern;

etching the capacitor contact pads along the first pattern, to form the first recesses on the first surfaces of the capacitor contact pads; and removing the photoresist layer.

8. The method for manufacturing a memory of claim 1, wherein the forming a second plate on the barrier layer, the second plate being formed with a plurality of first hole structures, the plurality of the first hole structures being in one-to-one correspondence with the plurality of the capacitor contact pads comprises:

forming a first electrode layer on the barrier layer;

forming a hard mask layer on the first electrode layer, the hard mask layer being formed with a plurality of etching holes, and the plurality of the etching holes being in one-to-one correspondence with the plurality of the capacitor contact pads;

etching the first electrode layer along the etching holes, to form the first hole structures; and removing the hard mask layer.

9. The method for manufacturing a memory of claim 1, wherein the forming the first plates in the third hole structures, the first plates being electrically connected to the capacitor contact pads and covering the conductive pillars comprises:

forming a second electrode layer in the third hole structures and on the protective layer, the dielectric layer and the second plate, the second electrode layer being in contact with the capacitor contact pads; and removing part of the second electrode layer on the dielectric layer and on the second plate, remaining part of the second electrode layer forming the first plates.

10. The method for manufacturing a memory of claim 1, wherein after the forming the plurality of capacitors composited by the second plate, the dielectric layer and the first plates, the plurality of the capacitors and the plurality of the capacitor contact pads corresponding one to one and being electrically connected, the method further comprises:

forming an insulating layer on the second plate, the dielectric layer and the first plates;

removing part of the insulating layer, to expose part of the second plate, remaining part of the insulating layer covering the first plates; and forming a second conductive layer on the second plate and the insulating layer.

* * * * *